(12) United States Patent
Malek et al.

(10) Patent No.: US 9,215,826 B2
(45) Date of Patent: Dec. 15, 2015

(54) ELECTRONIC DEVICES HAVING MULTI-PURPOSE COWLING STRUCTURES AND A COMPASS MOUNTED ON A FLEX CIRCUIT

(71) Applicant: Apple Inc., Cupertino, CA (US)

(72) Inventors: Shayan Malek, San Jose, CA (US);
Jared M. Kole, San Jose, CA (US);
Nicholas Ian Lubinski, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 20 days.

(21) Appl. No.: 14/245,889

(22) Filed: Apr. 4, 2014

(65) Prior Publication Data

US 2014/0218874 A1 Aug. 7, 2014

Related U.S. Application Data

(62) Division of application No. 12/987,978, filed on Jan. 10, 2011, now Pat. No. 8,693,204.

(51) Int. Cl.
| | |
|---|---|
| *H05K 1/00* | (2006.01) |
| *H05K 7/02* | (2006.01) |
| *G01C 17/28* | (2006.01) |
| *H01Q 1/52* | (2006.01) |
| *G01C 17/02* | (2006.01) |
| *G01R 33/02* | (2006.01) |
| *H05K 1/02* | (2006.01) |
| *H05K 1/14* | (2006.01) |
| *H05K 1/18* | (2006.01) |

(52) U.S. Cl.
CPC ........ *H05K 7/02* (2013.01); *G01C 17/02* (2013.01); *G01C 17/28* (2013.01); *G01R 33/02* (2013.01); *H01Q 1/526* (2013.01); *H05K 1/028* (2013.01); *H05K 1/147* (2013.01); *H05K 1/189* (2013.01)

(58) Field of Classification Search
USPC ......... 361/728–730, 749, 752, 759, 796, 799, 361/800, 807, 809, 810, 816, 818
See application file for complete search history.

(56) References Cited

U.S. PATENT DOCUMENTS

| | | | |
|---|---|---|---|
| 4,875,457 A | 10/1989 | Fitzner | |
| 5,668,316 A | 9/1997 | Iwai et al. | |
| 7,612,559 B2 * | 11/2009 | Koivuaho | 324/244 |
| 8,000,104 B2 * | 8/2011 | Kim et al. | 361/730 |
| 8,337,220 B2 | 12/2012 | Powell | |
| 8,537,564 B2 | 9/2013 | Cohen et al. | |
| 8,547,708 B2 * | 10/2013 | Arai | 361/807 |
| 8,576,569 B2 | 11/2013 | Malek et al. | |
| 2002/0080593 A1 | 6/2002 | Tsuge et al. | |
| 2003/0184108 A1 * | 10/2003 | Donovan et al. | 296/24.1 |
| 2006/0113992 A1 * | 6/2006 | Tilbrook et al. | 324/249 |
| 2007/0262906 A1 | 11/2007 | Haim et al. | |
| 2012/0170177 A1 * | 7/2012 | Pertuit et al. | 361/679.01 |

\* cited by examiner

*Primary Examiner* — Hung S Bui
(74) *Attorney, Agent, or Firm* — Joseph F. Guihan

(57) ABSTRACT

Multi-purpose cowling structures are provided to minimize spacing impact within an electronic device, while maximizing functional utility. In one embodiment, an electromagnetic interference shield may provide one or more anchors for enabling a logic board cowling to apply sufficient downward force to one or more board connectors to prevent inadvertent disconnects. In another embodiment, a cowling can electrically connect the ground plane of a logic board to the ground plane of a housing member and provide a pre-load force to a conductor connection existing on logic board. A compass mounted on a flexible printed circuit board is also provided. Mounting the compass on a flexible printed circuit board enables the compass to be mounted remote from ferrous object that may affect the compass's performance.

19 Claims, 9 Drawing Sheets

ELECTRONIC DEVICES HAVING MULTI-PURPOSE COWLING STRUCTURES AND A COMPASS MOUNTED ON A FLEX CIRCUIT

This application is a divisional of U.S. patent application Ser. No. 12/987,978, filed Jan. 10, 2011, which is hereby included in its entirety.

BACKGROUND

Portable electronic devices are ubiquitous in today's society and users of these devices expect each new generation to include more features, more power, longer battery life, and less weight. These expectations can place severe design constraints on packaging and board layout. In addition, the compressed packaging of components can result in electrical or magnetic interference that can affect the device's performance. Accordingly, structures are needed to alleviate the above-mentioned constraints and interference issues.

SUMMARY

Multi-purpose cowling structures are provided to minimize spacing impact within an electronic device, while maximizing functional utility. In one embodiment, an electromagnetic interference shield may provide one or more anchors for enabling a logic board cowling to apply sufficient downward force to one or more board connectors to prevent inadvertent disconnects. In another embodiment, a cowling can electrically connect the ground plane of a logic board to the ground plane of a housing member and provide a pre-load force to a conductor connection existing on logic board. A compass mounted on a flexible printed circuit board is also provided. Mounting the compass on a flexible printed circuit board enables the compass to be mounted remote from one or more ferrous objects that may affect the compass's performance.

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can be provided with mechanical and electrical components for providing different functionalities to a user. In some cases, components of an electronic device can be constructed to provide mechanical features that improve the performance, aesthetics, robustness and size of the electronic device.

Electronic devices that may be provided with these components can include desktop computers, computer monitors, computer monitors containing embedded computers, wireless computer cards, wireless adapters, televisions, set-top boxes, gaming consoles, routers, portable electronic devices such as laptop computers, tablet computers, and handheld devices such as cellular telephones and media players, and small devices such as wrist-watch devices, pendant devices, headphone and earpiece devices, and other wearable and miniature devices. Portable devices such as cellular telephones, media players, and other handheld electronic devices are sometimes described herein as an example.

Figure 1:
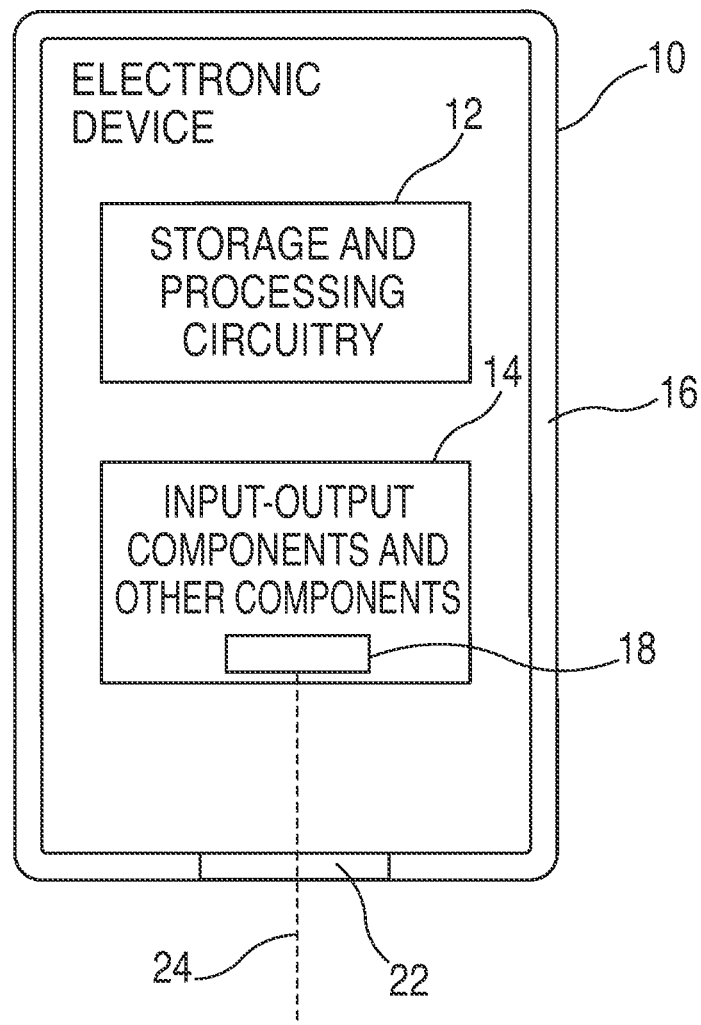
FIG. 1 is a schematic view of an illustrative electronic device that can be provided with mechanical and electrical features in accordance with one embodiment of the invention.

FIG. 1 shows an illustrative electronic device 10 according to an embodiment of the invention. As shown in FIG. 1, device 10 can include storage and processing circuitry 12. Storage and processing circuitry 12 can include one or more different types of storage such as hard disk drive storage, nonvolatile memory (e.g., flash memory or other electrically-programmable-read-only memory), volatile memory (e.g., static or dynamic random-access-memory), or combinations of these. Storage and processing circuitry 12 may be used in controlling the operation of device 10. Processing circuitry in circuitry 12 can be based on processors such as microprocessors, microcontrollers, digital signal processors, dedicated processing circuits, power management circuits, audio and video chips, and other suitable integrated circuits.

Storage and processing circuitry 12 can be used to run software on device 10, such as internet browsing applications, voice-over-internet-protocol (VOIP) telephone call applications, email applications, media playback applications, operating system functions, antenna and wireless circuit control functions, or combinations of these. Storage and processing circuitry 12 can be used in implementing suitable communications protocols. Communications protocols that may be implemented using storage and processing circuitry 12 can include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, or other such communications protocols.

Input-output devices 14 may be used to allow data to be supplied to device 10 and to allow data to be provided from device 10 to external devices. Examples of input-output devices 14 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, or combinations of these. A user can control the operation of device 10 by supplying commands through devices 14 or by supplying commands to device 10 through an accessory that communicates with device 10 through a wireless or wired communications link. Devices 14 or accessories that are in communication with device 10 through a wired or wireless connection may be used to convey visual or audio information to the user of device 10. Device 10 may include connectors for forming data ports (e.g., for attaching external equipment such as computers, accessories, etc.).

Various components of electronic device 10 may be contained in housing 16. Housing 16 can protect the internal components and may help keep the internal components in their assembled positions within device 10. Housing 16 may also provide aesthetics for device 10 (e.g., an ornamental appearance). The shape and construction of housing 16 can vary widely to accommodate different device 10 configurations. For example, housing 16 can be a multi-piece assembly of different parts that interconnect together to hold electronics and/or components (e.g., glass) in place. The parts may be constructed from the same or different materials. A more detailed example of multi-part assembly for housing 16 is discussed below in connection with FIG. 2. As another example, a portion of housing 16 can include a translucent/transparent portion through which internal components may optically communicate to the outside world.

Device 10 can include one or more optical systems 18. Each optical system 18 can include, for example, optical components that transmit and/or receive visual and/or non-visual spectrums of light through window or opening 22 in the housing 16. The optical components can, for example, correspond to one or more camera modules, proximity sensors, or ambient light sensors. For example, a camera module, which is situated inside housing 16, may be configured to capture image data outside the device 10 via window 22 by a line of sight that passes through window 22. Device 10 can include one or more alignment structures for ensuring proper mounting and operation of optical system 18.

Figure 2A:
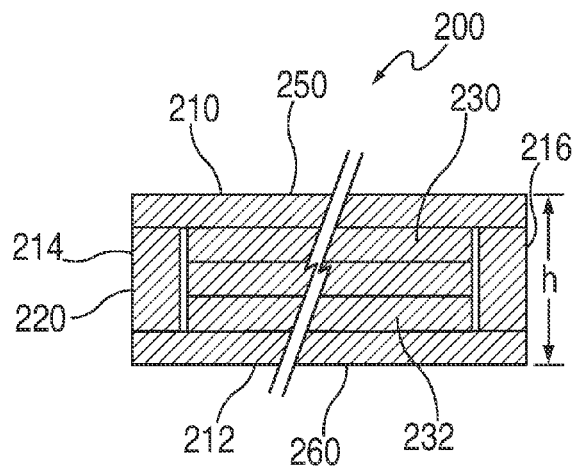
FIG. 2A is a cross-sectional view of an illustrative electronic device structure taken along the device width in accordance with one embodiment of the invention.
Figure 2B:
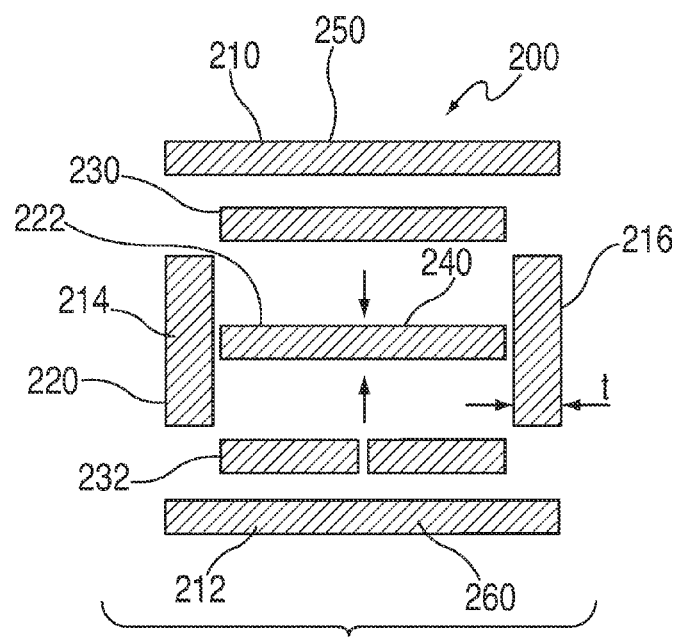
FIG. 2B is an exploded cross-sectional view of an illustrative electronic device taken along the device length in accordance with one embodiment of the invention.
Figure 2C:
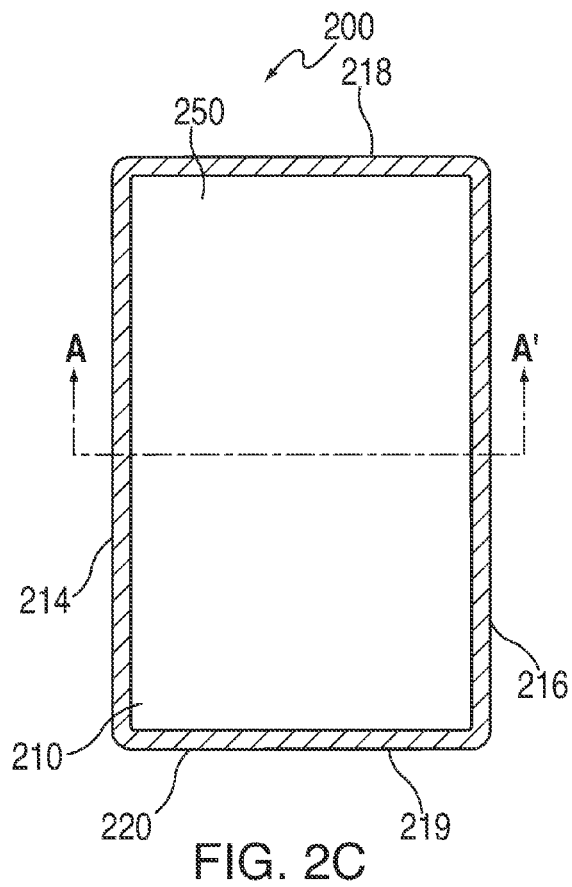
FIG. 2C is a top view of an illustrative electronic device in accordance with one embodiment of the invention.
Figure 2D:
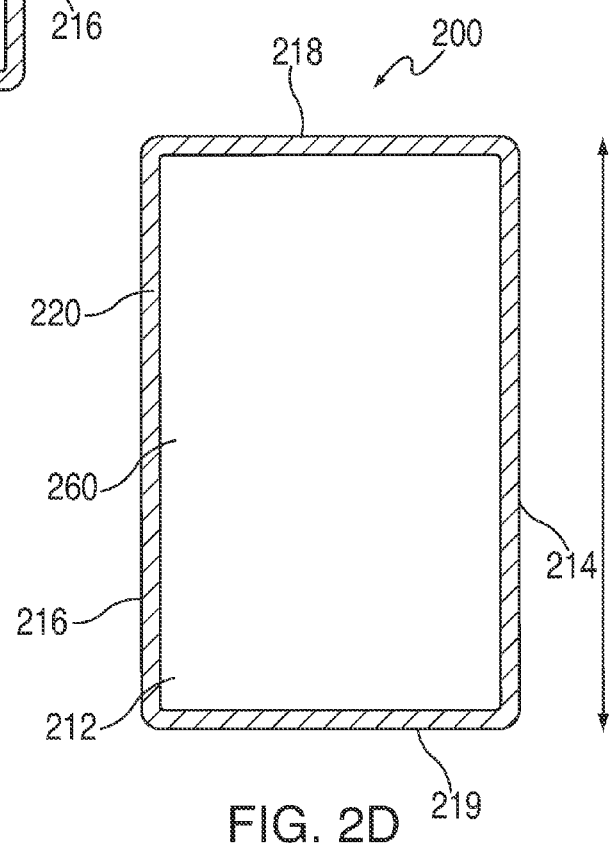
FIG. 2D is a bottom view of an illustrative electronic device in accordance with one embodiment of the invention.

A housing member of an electronic device (e.g., housing 16 of electronic device 10 of FIG. 1) can provide a variety of attributes to the electronic device including, for example, structural attributes, functional attributes, cosmetic attributes, or combinations thereof. In some cases, a housing member can form an external component of the electronic device, and therefore provide the mechanical structure for the device. A housing member can be provided in any suitable form. In some embodiments, the housing member can include an outer periphery member. FIG. 2A is a cross-sectional view of an illustrative electronic device structure having an outer periphery member taken along the device width in accordance with one embodiment of the invention. FIG. 2B is an exploded cross-sectional view of an illustrative electronic device having an outer periphery member taken along the device length in accordance with one embodiment of the invention. FIG. 2C is a top view of an illustrative electronic device having an outer periphery member in accordance with one embodiment of the invention. FIG. 2D is a bottom view of an illustrative electronic device having an outer periphery member in accordance with one embodiment of the invention.

Electronic device 200 can include any suitable type of electronic device including, for example, one or more of the types of electronic devices described above in connection with device 10 (FIG. 1).

Electronic device 200 can have any suitable shape including, for example, a shape delimited by front surface 210, back surface 212, left surface 214, right surface 216, top surface 218 (not shown in the cross-sections of FIGS. 2A and 2B) and bottom surface 219 (not shown in the cross-sections of FIGS. 2A and 2B). Each surface can be substantially planar, curved, or combinations of these. The surfaces can include one or more chamfers, detents, openings, dips, extensions, or other features modifying the smoothness of the surfaces.

Electronic device 200 can be constructed using any suitable structure, including for example using outer periphery member 220. Outer periphery member 220 can form a loop that surrounds or wraps around some or all of the electronic device. The loop formed by outer periphery member 220 can define internal volume 222 into which electronic device components can be placed. For example, outer periphery member 220 can wrap around the device such that the external surfaces of outer periphery member 220 define some or all of left surface 214, right surface 216, top surface 218 and bottom surface 219 of the device. To provide a desired functionality to a user, the electronic device can include several components placed within the device such as, for example, within volume 222.

Outer periphery member 220 can have a particular height (e.g., the device height h) that serves to define an amount of volume 222. In particular, volume 222, or individual measurable quantities of outer periphery member 220 (e.g., height, thickness, length, or width) can be selected to provide at least a minimum volume amount required for receiving and securing electronic device components. In some embodiments, other criteria can instead or in addition drive the measurable quantities of outer periphery member 220. For example, the thickness (e.g., outer periphery member thickness t as shown in FIG. 2B), length (e.g., device length l as shown in FIG. 2A), height (e.g., device height h as shown in FIG. 2D), and cross-section of the outer periphery member can be selected based on structural requirements (e.g., stiffness, or resistance to bending, compression, tension or torsion in particular orientations). As another example, the measurable quantities of outer periphery member 220 can be selected based on a desired device size or shape, which may be driven by industrial design considerations.

In some embodiments, the outer periphery member 220 can serve as a structural member to which other electronic device components can be mounted. In particular, it may be desirable to secure individual electronic device components placed within device 200 to ensure that the components do not move and break, which could adversely affect the functionality of the device. Outer periphery member 220 can include any suitable feature for securing a device component. For example, outer periphery member 220 can include one or more depressions, recesses, channels, protrusions, or openings for receiving or engaging electronic device components.

In some embodiments, outer periphery member 220 can instead or in addition include features for retaining internal structural device components to which other components can be secured. For example, an internal structure such as an internal platform (described below in more detail) can be coupled to an internal surface of outer periphery member 220, such that other electrical components can be mounted to the internal platform. In some embodiments, outer periphery member 220 can include one or more openings to provide access to one or more internal components retained within volume 222.

Outer periphery member 220 (or device 200) can have any suitable cross-section. For example, outer periphery member 220 can have a substantially rectangular cross-section. In some embodiments, outer periphery member 220 can instead or in addition have a cross-section in a different shape including, for example, a circular, oval, polygonal, or curved cross-section. In some embodiments, the shape or size of the cross-section can vary along the length or width of the device (e.g., an hourglass shaped cross-section).

Outer periphery member 220 can be constructed using any suitable approach. In some embodiments, outer periphery member 220 can be constructed by connecting several distinct elements together. For example, outer periphery member 220 can be constructed by connecting three distinct elements together.

The elements can be formed from any suitable material including, for example, a metal. The individual elements can also be formed using any suitable approach. For example, an element can be formed using cold work. As another example, an element can instead or in addition be formed using a forging process, an annealing process, a machining process, or any other suitable process or combination of processes. In some embodiments, the elements can be included in one or more electrical circuits (e.g., as part of an antenna assembly, or as a heart-rate monitor).

Any suitable approach may be used to connect the individual elements of outer periphery member 220. In some embodiments, a fastener or adhesive can be used to connect the individual elements. In other embodiments, individual elements can be connected to each other or to other electronic device components using a braising process (e.g., connecting a ceramic material to an individual component serving as part of an antenna). In further embodiments, intermediate elements can instead or in addition be placed between adjacent individual elements to securely connect the individual elements together. For example, an intermediate element can be formed from a material (e.g., a plastic material) that can change from a first state to a second state. In the first state, the material of the intermediate element can flow in a gap between adjacent individual elements. In the second state, the material can adhere to the adjacent individual elements, and provide a structural bond between the individual elements such that the individual elements and the intermediate element form an integral component.

In some embodiments, the individual elements can be formed from a conductive material, while the intermediate elements can be formed from an insulating or dielectric material. This can ensure that different electrical circuits that include individual elements do not interfere with one another. In addition, the dielectric material in gaps between individual elements can help control capacitance, radio frequency energy, and other electrical transfers across the gaps.

Connecting individual elements together using an intermediate element can create artifacts or other imperfections along the interfaces between the individual elements and the intermediate element. For example, excess material of the intermediate element can flash or spill beyond a boundary of the interface, and onto an external surface of one of the individual elements. To ensure that the resulting component is aesthetically pleasing and satisfies industrial design requirements, the component can be processed to remove excess material from one or more of the individual elements and the intermediate element. For example, a single process or tool can be used to finish the different elements. The single process can be applied at a single setting including, for example, a setting corresponding to the softest material of the individual elements and the intermediate element used to form a component.

In some cases, the process can instead or in addition dynamically adjust the manner in which the process is applied based on the material or element being processed. For example, the force, speed or tool type used can vary based on the element being processed. The resulting component can include a continuous surface across an interface between an individual element and an intermediate element. For example, the resulting component can include a smooth surface across a seam between two elements.

Electronic device components can be placed within volume 222 using any suitable approach. For example, electronic device 200 can include components 230 and 232 inserted into volume 222. Each of components 230 and 232 can include individual components, or several components assembled together as a component layer or stack, or include several distinct layers of components to insert within volume 222. In some embodiments, components 230 and 232 can each represent several components stacked along the height of the device. The component layers can be electrically coupled to each other to enable data and power transfers, as required for the proper operation of electronic device 200. For example, the component layers can be electrically coupled using one or more of a PCB, flex, solder, SMT, wires, connectors, or combinations of these. The component layers can be inserted into outer periphery member 220 using any suitable approach. For example, components 230 and 232 can all be inserted from front surface 210 or from back surface 212 (e.g., back to front, front to back, or middle to front and back). Alternatively, the components can be inserted from both front surface 210 and back surface 212.

In some embodiments, one or more of the components can serve as a structural element. Alternatively, electronic device 200 can include a distinct structural element placed within volume 222 and coupled to outer periphery member 220. For example, electronic device 200 can include one or more internal members or platforms 240, which can serve as a mounting points or regions for helping to secure, hold or pack one or more component layers (e.g., attaching component 230 to the back surface of internal platform 240, and component 232 to the front surface of internal platform 240). Internal platform 240 can be coupled to outer periphery member 220 using any suitable approach including, for example, using snaps, fasteners, flexures, welds, glue, or combinations of these. Alternatively, internal platform 240 may even be part of outer periphery member 220 (e.g., machined, extruded, or cast, or integrally formed as a single unit). Internal platform 240 can have any suitable size including, for example, a size that is smaller than the internal volume of outer periphery member 220.

Internal platform 240 can be positioned at any suitable height within outer periphery member 220 including, for example, substantially at half the height of outer periphery member 220. The resulting structure (e.g., outer periphery member 220 and internal platform 240) can form an H-shaped structure that provides sufficient stiffness and resistance to tension, compression, torsion and bending.

Internal platform 240, inner surfaces of the outer periphery members 220, or both can include one or more protrusions, depressions, shelves, recesses, channels, or other features for receiving or retaining electronic device components. In some cases, internal platform 240, outer periphery member 220 or both can include one or more openings for coupling components located in the front and back regions of internal platform 240. The size of each region can be selected based on any suitable criteria including, for example, operational needs of system, numbers and types of electrical components in device 200, manufacturing constraints of internal platform 240, or combinations of these. Internal platform 240 can be constructed as a distinct component from any suitable material (e.g., plastic, metal or both), or instead defined from an existing electronic device component placed within volume 222 defined by outer periphery member 220. For example, internal platform 240 can be formed by a printed circuit board or chip used by the device.

In some embodiments, internal platform 240 can include one or more electrically conductive elements for providing electrical connections between the components. For example, internal platform 240 can include one or more PCB, flex, wire, solder pad, cable, connector, or other electrically conductive mechanism for connecting components within the device.

Electronic device 200 can include front cover assembly 250 and back cover assembly 260 defining the front and back surfaces, respectively, of device 200. The front and back cover assemblies 250 and 260 can include one or more components, or can include at least a front member and a back member that form some or all of the outer front and back surfaces of the device. Front and back cover assemblies 250 and 260 can be flush, recessed or protruding relative to the front and back surfaces of outer periphery member 220. In the example of FIGS. 2A and 2B, front cover assembly 250 and back cover assembly 260 can be proud or protrude above front and back edges of outer periphery member 220 (e.g., such than an interior surface of cover assemblies 250 and 260 is flush with a front or back surface of outer periphery member 220).

Alternatively, one or both of the cover assemblies 250 and 260 can be flush or sub-flush relative to outer periphery member 220 in order, for example, to prevent the edges from engaging other surfaces (e.g., at least a portion of cover assemblies 250 and 260 can be included within volume 222). In some embodiments, one or both of front cover assembly 250 and back cover assembly 260 can include one or more windows. Any suitable information or content can pass through the windows. For example, a cover assembly can include a window through which a camera can capture images. As another example, a cover assembly can include a window through which content provided by a display may be made available, or through which light (e.g., from a flashlight) can be provided.

In some embodiments, different components of electronic device 200 can be substantially made of glass. For example, portions of the electronic device housing can have at least 75% of its exterior as glass. In one implementation, one or both of cover assemblies 250 and 260 can include a glass element providing a substantial portion of the cover assembly. In particular, front and back surfaces 210 and 212 of the device can include substantial amounts of glass, while left, right, top and bottom surfaces 214, 216, 218, and 219 of the device can include substantial amounts of a metal (e.g., steel).

In some embodiments, the housing of a portable electronic device 200 can be banged or rubbed against various surfaces. When plastic or softer metal housing surfaces are used, the surfaces tend to become scratched. On the other hand, glass housing surfaces (e.g., glass cover assemblies) can be more scratch resistant. Moreover, glass housing surfaces can offer radio transparency, while metal housing surfaces can disturb or hinder radio communications. In one embodiment, an electronic device housing can use glass housing members (e.g., glass cover assemblies) for front surface 210 and back surface 212 of the electronic device housing. For example, front surface 210 formed from a glass housing member can be transparent to provide visual access to a display device positioned behind the glass housing member at the front surface, while back surface 212 formed from a glass housing member can be transparent or non-transparent. Non-transparency, if desired, can conceal any interior components within the electronic device housing. In one embodiment, a surface coating or film can be applied to the glass housing member to provide non-transparency or at least partial translucency. Such a surface coating or film can be provided on an inner surface or an outer surface of the glass housing member.

Figure 3:
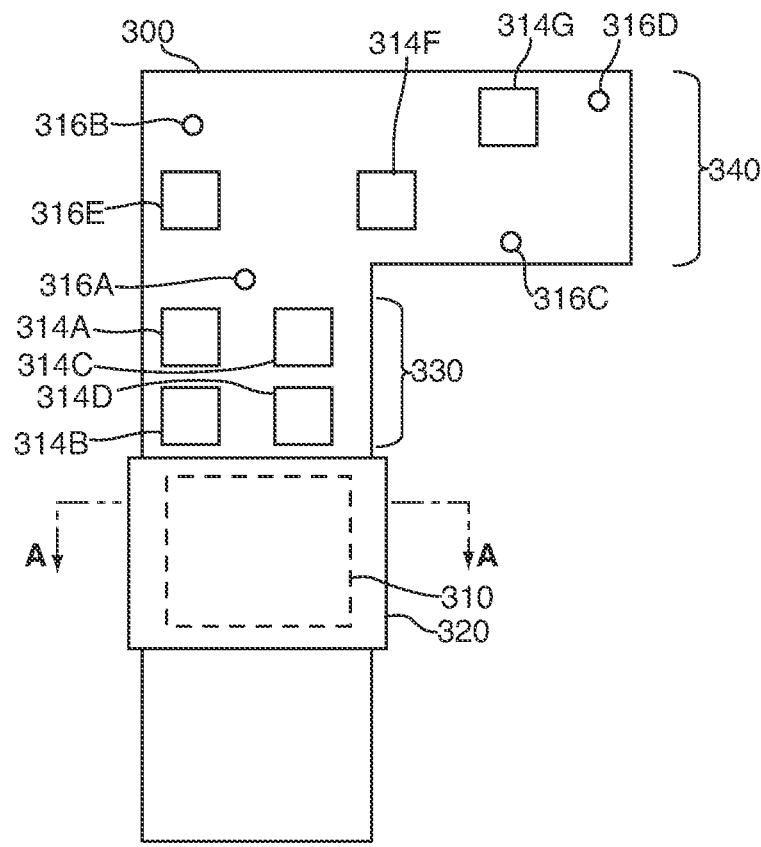
FIG. 3 shows an illustrative top view of a main logic board in accordance with an embodiment of the invention.

FIG. 3 shows an illustrative top view of a main logic board ("MLB") 300 in accordance with an embodiment of the invention. MLB 300 may be positioned on an internal platform (e.g., such as internal platform 240 of FIGS. 2A and 2B) or on some other structure within the device. MLB 300 can be populated with integrated circuits, such as IC circuit 310, board connections 314A-G, coupling structures 316A-D, traces (not shown), and any other suitable circuitry or components. IC circuit 310 is shown with dashed lines because it is covered by EMI shield 320. Board connections 314A-G can be locations where a physical connection is made. For example, board connection 314 can be locations where traces (e.g., a flex cable or co-axial cable) or IC circuits are connected to the board.

Coupling structures 316A-D enable coupling of MLB 300 to a housing structure such as an internal platform, or enable a cowling to be affixed to the top of MLB 300, or a combination thereof. The cowling can be a plate that applies a force to board connections 314 in order to prevent these connections from experiencing a disconnect event. But for the cowling, the one or more of board connections 314 may disconnect when the device is dropped, shaken, or subject to some other disconnection event. Coupling structures 316A-D can receive a fastening component such as a screw or a fastener that physically couples any suitable combination of the cowling, MLB 300, and housing structure together. In some embodiments, coupling structures 316A-D can be embedded in MLB 300 or they can be raised structures mounted to a surface of MLB 300. In other embodiments, coupling structures 316 A-D may be a through-hole that permits passage of a screw, fastener, or other securing component there through to a housing structure.

Due to the real estate constraints on MLB 300 and necessary positioning of circuitry such as IC circuit 310 and board connections 314A-G, it may not be possible to place coupling structures 316A-D in non-coupling region 330. As shown, board connections 314A-D exist in non-coupling region 330, whereas board connections 314E-G exist in coupling region 340. Non-coupling region 330 is a region of MLB 300 devoid of any coupling structures 316A-D and coupling region 340 is a region of MLB 300 that includes one or more coupling structures 316A-D. Non-coupling region 330 abuts EMI shield 320 and IC circuit 310, which prevents inclusion of one or more coupling structure 316A-D. Moreover, board connections 314A-G located in non-coupling region 330 may be more susceptible to disconnect events than their coupling region 340 counterparts because the necessary number of coupling structures 316A-D cannot be placed where needed (e.g., located in the positions of IC circuit 310 and EMI shield 320).

Figure 4:
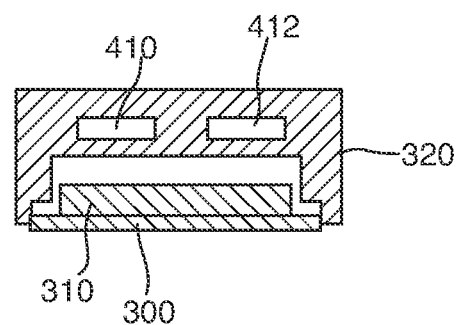
FIG. 4 shows a cross-sectional view of the logic board of FIG. 3 taken along line A-A in accordance with an embodiment of the invention.

To compensate for the lack of one or more coupling structures in the locations of IC circuit 310 and EMI shield 320, EMI shield 320 may be constructed to provide one or more cowling anchor positions to mitigate the potential for any disconnect events in non-coupling region 330. FIG. 4 shows a cross-sectional view of MLB 300, IC circuit 310, EMI shield 320, taken along line A-A of FIG. 3. In particular, FIG. 4 shows EMI shield 320 having anchor slots 410 and 412 for receiving cowling tabs (not shown in this FIG., but shown in FIGS. 5-7). Although two anchor slots are shown, EMI shield 320 can include one anchor slot or two or more slots.

The size and shape of slots 410 and 412 can vary. For example, the slots 410 and 412 can be rectangular slits in the side wall of EMI shield 320. As another example, slots 410 and 412 can be cavities existing within EMI shield 320. Slots 410 and 412 may be constructed to secure cowling tabs in place, which by extension enables the cowling to apply sufficient force to board connections 314A-D when secured to MLB 300. For example, slots 410 and 412 may have structures such as spring members that assist in securing the cowling tab(s) in place within EMI shield.

Figure 5:
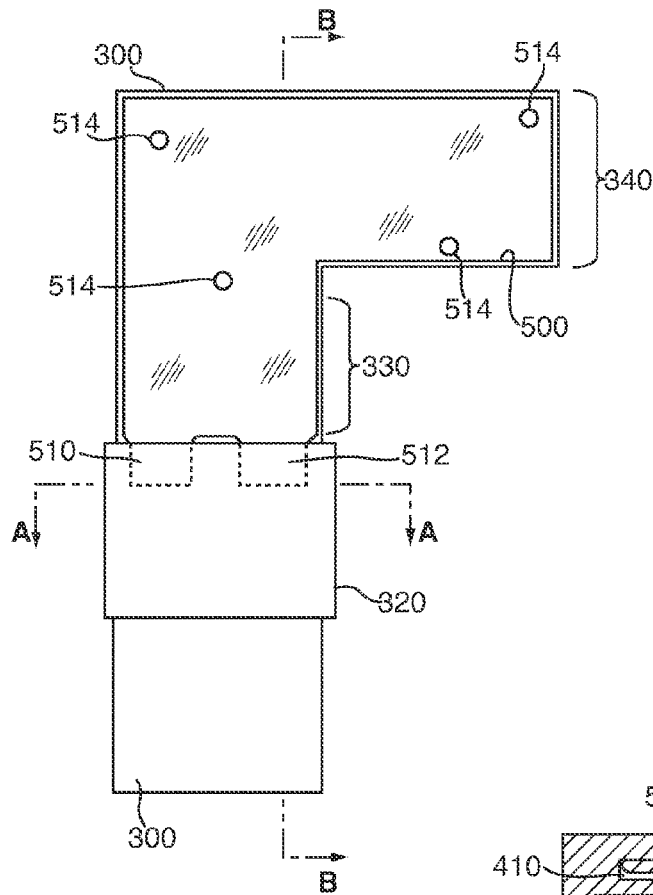
FIG. 5 shows an illustrative top view of a logic board with a cowling mounted on top in accordance with an embodiment of the invention.

FIG. 5 shows an illustrative top view of MLB 300 with a cowling 500 mounted on top of MLB 300 in accordance with an embodiment of the invention. Cowling 500 can be a substantially flat plate constructed from any suitable material such as steel or plastic that is mounted on top of at least a portion of MLB 300. Cowling 500 can include tabs 510 and 512 and can be shaped to conform to the contours of MLB 300. Although only two tabs are shown, any suitable number of tabs may form part of cowling 500. In addition, cowling 500 may take any suitable shape. Cowling 500 also includes through-holes 514 that align with coupling structures (not shown). A fastener such as a pin or screw can be inserted into each through-hole 514 to secure cowling 500 to MLB 300.

When cowling 500 is secured to the top of MLB 300, and tabs 510 and 512 are inserted into their respective anchor slots, cowling 500 can exert sufficient downward pressure on each of board connections 314A-D (the connections located in non-coupling region 330) to prevent undesired disconnect events. Anchors 410 and 412 (FIG. 4) effectively serve as a coupling structure even though an actual coupling structure (e.g., one of coupling structures 316A-D of FIG. 3) cannot be placed in the location of anchors 410 and 412.

Figure 6:
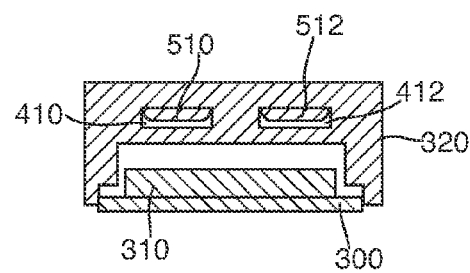
FIG. 6 shows an illustrative cross-sectional view of the logic board of FIG. 5 taken across line A-A in accordance with an embodiment of the invention.

FIG. 6 shows an illustrative cross-sectional view of MLB 300, IC circuit 310, EMI shield 320, and cowling tab 510 and 512 taken across line A-A of FIG. 5 in accordance with an embodiment of the invention. As shown, cowling tabs 510 and 512 are positioned within anchor slots 410 and 412.

Figure 7:
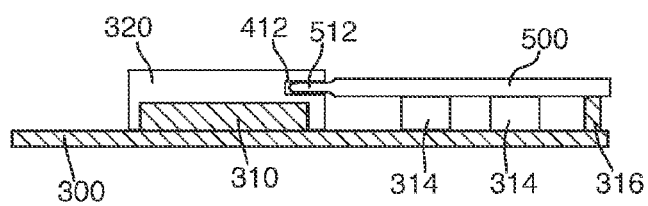
FIG. 7 shows an illustrative cross-sectional view of the logic board of FIG. 5 taken across line B-B in accordance with an embodiment of the invention.

FIG. 7 shows an illustrative cross-sectional view of MLB 300, IC circuit 310, EMI shield 320, and cowling tab 512 taken across line B-B of FIG. 5 in accordance with an embodiment of the invention. As shown, cowling tab 512 is shown positioned within anchor slot 412 a predetermined distance past the sidewall of EMI shield 320. This provides adequate leverage for cowling 500 to exert the necessary force on connections 314. Note that cowling 500 is flush against connection 314.

Some devices may include a compass, which can be accessed by various programs such as games, navigation programs, and map programs. These devices can use a solid state compass, known as a magnetometer. Different types of magnetometers exist such as scalar magnetometers, which can measure the total strength of a magnetic field, and vector magnetometers, which can measure a component of a magnetic field in a particular direction relative to the spatial orientation of the device.

In order for a magnetometer to operate within acceptable performance levels, it needs to be positioned a minimum distance away from ferrous objects such as a speaker or motor, and be mounted on a rigid structure. Ferrous objects can affect the magnetometer's ability to accurately quantify the earth's magnetic field. A rigid mounting of the magnetometer is needed to prevent it from moving in any direction, as it would otherwise be unable to accurately determine a direction relative to the device. For example, consider a scenario where a user is holding his or her magnetometer-enabled device. As the user handles the device, it will be pitched and yawed. If the compass is not fixed to a rigid support structure, it will yield erroneous directional readings.

Conventionally, in portable electronic devices, magnetometers are mounted onto a logic board, as the board can provide a sufficiently rigid structure. However, as devices continue to shrink in size and incorporate additional hardware to accommodate ever increasing feature sets, space, especially board space, is severely limited. Thus, as boards become more compact and dense with electronics and other components, including ferrous components, there may be a need to position the magnetometer remote from the logic board.

In addition, even if the magnetometer can be located off board, it needs to be mounted on a rigid structure and be coupled to circuitry in order to receive power and communicate data. Therefore, in accordance with embodiments of this invention, a magnetometer, which is mounted on a flexible printed circuit board, is located remote to a logic board. The portion of the flexible printed circuit board having the magnetometer attached thereto is mounted to a rigid structure.

Figure 8:
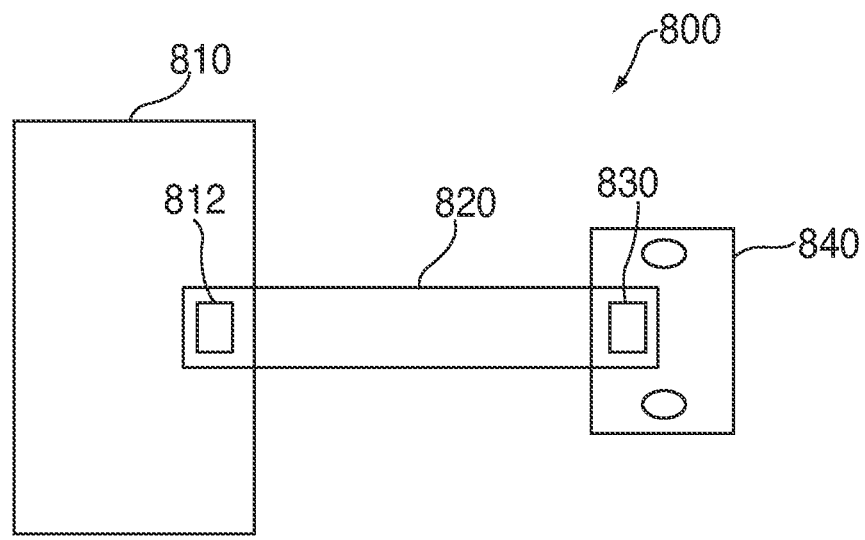
FIG. 8 shows an illustrative schematic of a compass located on a flexible printed circuit board in accordance with an embodiment of the present invention.

FIG. 8 shows an illustrative schematic 800 of a compass located on a flexible printed circuit board in accordance with an embodiment of the present invention. Schematic 800 includes logic board 810 with board connector 812, flexible printed circuit board 820 having compass 830 attached thereto, and mounting structure 840. As used herein, compass 830 refers to any suitable solid state or MEMs type of compass, sometimes referred to as a magnetometer. Logic board 810 can be any suitable board such as a printed circuit board that can hold circuitry, board connectors, traces, and mounting fixtures. For example, board 810 can be a simplified version of a board that may be attached to an internal platform (e.g., internal platform 240 of FIG. 2B).

Board connector 812 can be any suitable connector suitable for interfacing with flexible printed circuit board 820 (hereinafter "flex circuit 820"). Flex circuit 820 can be any suitable flexible substrate on which an electronic device such as a compass can be mounted. Flex circuit 820 can include traces for enabling transfer of data and power. These traces can route data signals between board connector 812 and compass 830 and provide power from board 810 to compass 830. The portion of flex circuit 820 on which compass 830 is mounted may be referred to herein as the compass/flex circuit portion. It is this portion that is securely mounted to mounting structure 840.

Mounting structure 840 can be any structure within the electronic device (other than a logic board) having sufficient structural integrity suitable for mounting the compass/flex circuit portion. In addition, mounting structure 840 can enable the compass/flex portion to be mounted in a desired orientation (e.g., such that compass 830 can be positioned in the proper X, Y, and Z axes orientation). Examples of mounting structure 840 include the internal platform (e.g., internal platform 240 of FIG. 2B) or the inner surface of the outer periphery member (e.g., periphery member 220 of FIGS. 2A-D).

The compass/flex circuit portion can be mounted to mounting structure 840 using any suitable technique. For example, brackets may be placed over the entire compass/flex portion, or a portion thereof, and may be fastened to mounting structure 840. As another example, the flex portion can be secured to mounting structure 840 by fasteners.

Figure 9:
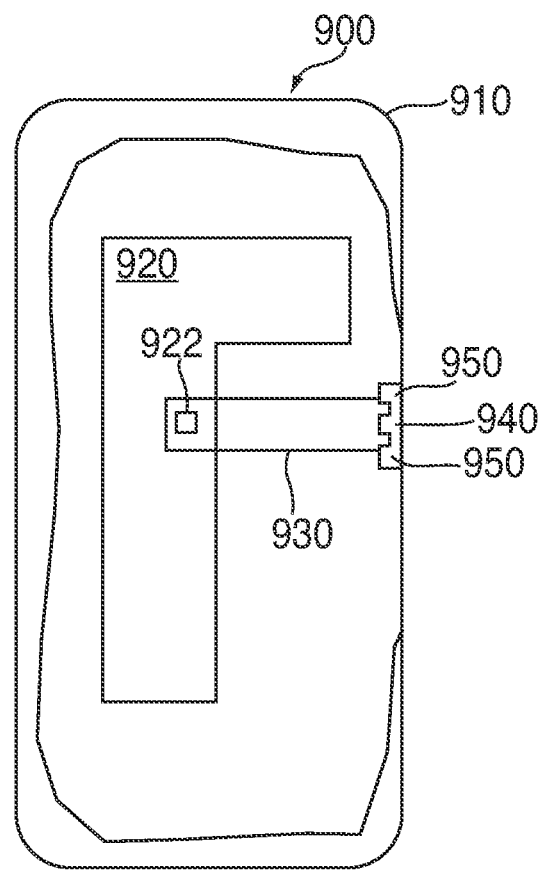
FIG. 9 shows an illustrative cut-away top view of a portion of a device having a compass mounted in accordance with an embodiment of the invention.

FIG. 9 shows an illustrative cut-away top view of a portion of device 900 having a compass mounted in accordance with an embodiment of the invention. Device 900 can include outer periphery member 910, logic board 920, connector 922, flex circuit 930, and compass 940. As shown, flex circuit 930 electrically couples compass 940 to board 920 via connector 922. Compass 940 is mounted to the inside surface of periphery member 910. Mounting bracket 950 may secure compass 940 and a portion of flex circuit 930 to periphery member 910.

As electronic devices are assembled, various physical and electrical connections are necessary to ensure proper operation of the device. Some of these connections can be grounding connections that provide an electrical pathway between one component (e.g., a logic board) and another component (e.g., chassis ground plane). Other connections may secure a logic board to a device housing (e.g., internal platform 240 of FIG. 2B). Yet other connections can secure a co-axial cable, flex circuit, or another signal and/or power conducting medium to a predetermined location within the device.

The physical coupling of these connections can be attained by solder connections, threaded screw connections, heat weld connections, pressure connections (e.g., where force such as a spring force makes the connection), or any other suitable connections. Some of these connections provide stronger, more secure, physical connections than others. For example, a threaded screw connection may be a more secure connection than a solder connection. The stronger, more secure, connections (e.g., threaded connections) are generally more desirable, but inclusion of such connections typically command higher space premiums and more limited placement options than their less robust connection counterparts.

Figure 10:
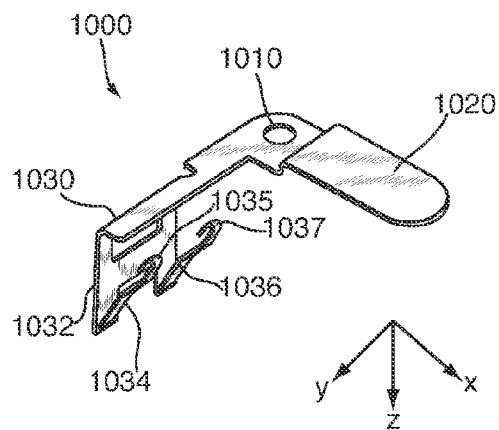
FIG. 10 illustrates an isometric view of a multi-purpose cowling in accordance with an embodiment of the invention.
Figure 11A:
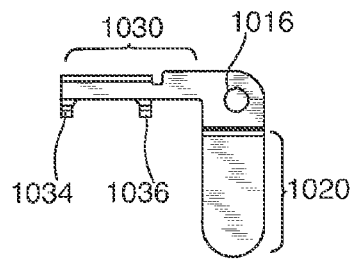
FIGS. 11A-C show respective illustrative top, side, and bottom views of the cowling of FIG. 10 in accordance with embodiments of the invention.
Figure 11B:
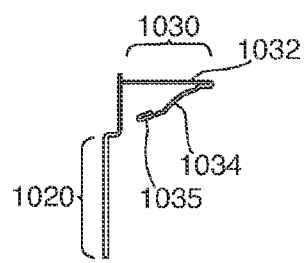
Figure 11C:
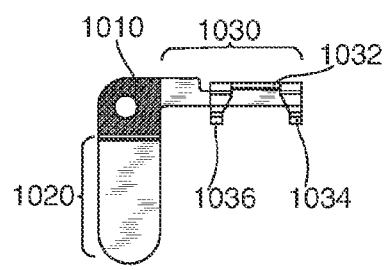
Figure 12:
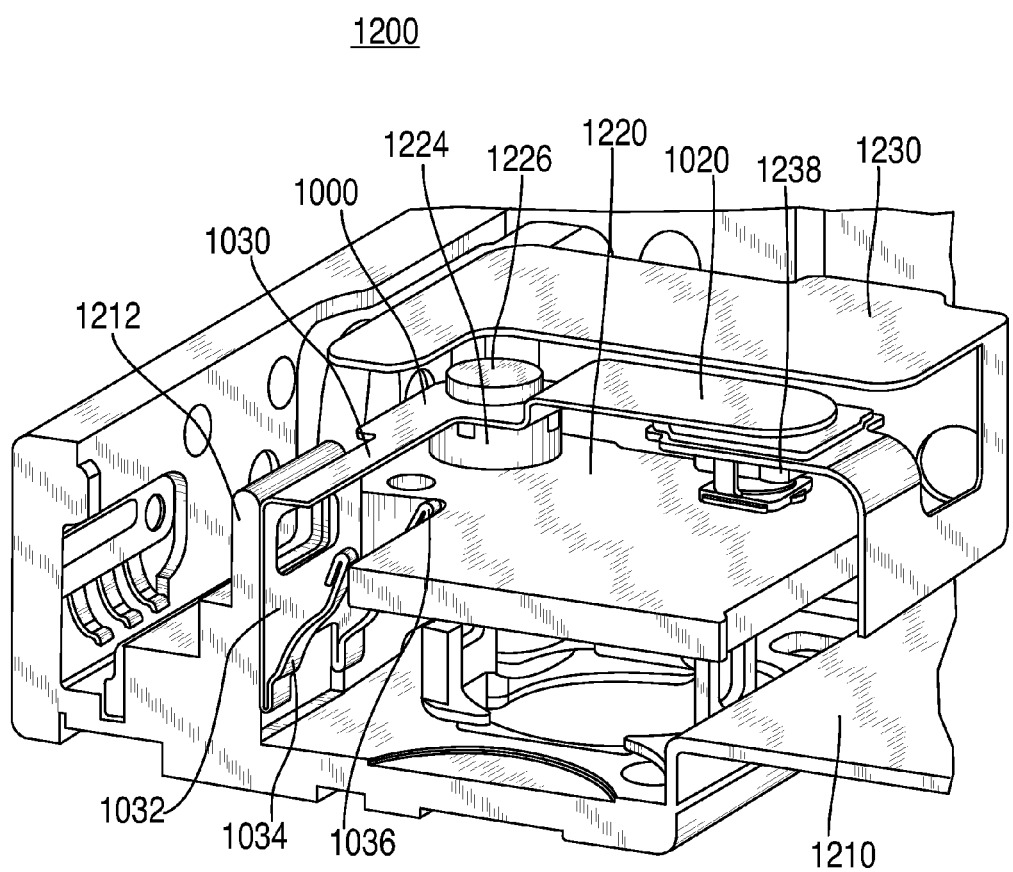
FIG. 12 shows an illustrative partial cut-away view of a device having a cowling mounted therein in accordance with an embodiment of the invention.

FIGS. 10-12 discuss in more detail embodiments of multipurpose cowlings that leverage a strong, secure connection such as a threaded connection to enable the cowling to provide another connection and structural support for a less secure connection. In particular, cowlings according to embodiments of this invention are of single piece construction that provides a grounding connection as well as structural support for a connection that is not part of the cowling. The cowlings are shaped to minimize impact on board space requirements while simultaneously maximizing functional efficiency. This helps to satisfy design constraints that limit available board space while also providing strong connections such as threaded connections.

FIG. 10 illustrates an isometric view of a multi-purpose cowling 1000 in accordance with an embodiment of the invention. FIG. 10 shows a three-dimensional Cartesian coordinate legend to help identify which axis various features of cowling 1000 exist. Cowling 1000 can include members that extend in all three axes. As shown, cowling 1000 includes through-hole 1010, diving-board member 1020, and spring member 1030. Through-hole 1010 can represent an origination point of cowling 1000. The area immediately adjacent to through-hole 1010 may be substantially planar and shaped to accommodate the head portion of a screw (not shown). Thus, the substantially planar portion can be the portion that enables cowling 1000 to be securely connected to a logic board (not shown) or other suitable structure by the screw.

Diving-board member 1020 extends in the x-axis direction away from through-hole 1010. Member 1020 can be stepped up with respect to the plane in which through-hole 1010 exists and can extend a predetermined distance in the x-axis direction. The distal end of member 1020 (the portion opposite through-hole) can be biased to exert a force in the z-axis direction. Member 1020 may be manufactured to achieve this bias or it may be bent down in the z-axis direction. The step up may facilitate bias in the z-axis direction. It is understood that the step up can be eliminated and that member 1020 can exist in the same plane as through-hole 1010.

Spring member 1030 can extend a predetermined distance away from through-hole 1010 in the y-axis direction. The y-axis portion of member 1030 can exist in the same plane as through-hole 1010. Bracket 1032 exists at the distal end of member 1030 and extends in the z-axis direction. Spring arms 1034 and 1036 extend away from bracket 1032 at an angle between the x and z axes as shown. Spring arms 1034 and 1036 can apply a force in the x-axis direction. The distal end of each arm can have engagement members 1035 and 1037.

FIGS. 11A-C show respective illustrative top, side, and bottom views of cowling 1000 of FIG. 10 in accordance with embodiments of the invention. The reference numbers are kept consistent with the numbers used in FIG. 10. Cowling 1000 can be single piece construction machined from any suitable conductive material.

FIG. 12 shows an illustrative partial cut-away view of device 1200 having cowling 1000 mounted therein in accordance with an embodiment of the invention. Device 1200 shows, among other features, housing member 1210, cowling 1000, logic board 1220, standoff 1224, screw 1226, and antenna 1230. Housing member 1210 can be any suitable structure suitable for holding logic board 1220. As an example, housing member 1210 can be an internal platform such as internal platform 240 of FIG. 2B. Housing member 1210 may be constructed with a combination of plastic and metal materials. The metal materials may provide a ground plane for device 1200. As shown in FIG. 12, housing member 1210 has ground plane interface 1212, which is a metal component connected to the ground plane.

Logic board 1220 has its own ground plane (not shown), which may be distributed in one or more layers throughout the board. In order to provide desired grounding in device 1200, the ground plane of logic board 1220 is electrically coupled to the ground plane of housing member 1210. Cowling 1000 provides this electrical coupling. As shown, screw 1226 passes through the through-hole of cowling 1000 and engages standoff 1224 to physically secure cowling 1000 to logic board 1220. In some embodiments, the screw/standoff/board connection can also electrically couple the ground plane of board 1220 to cowling 1000.

When cowling 1000 is secured to board 1220, bracket 1032 is physically coupled to ground plane interface 1212. In addition, spring arms 1034 and 1036 are in physical contact with board 1220 when cowling 1000 is secured. Spring arms 1034 and 1036 can be coupled to an interface region inside of board 1220 (as shown) or can be coupled to an edge of board 1220. In either approach, arms 1034 and 1036 can apply pressure to board 1220, which ensures that bracket 1032 makes a solid electrical coupling to ground plane interface 1212.

The ground-to-ground coupling between housing member 1210 and board 1220 can be obtained in one of several different embodiments. In one embodiment, the ground coupling can be achieved in the following path: logic board ground plane, standoff 1224, screw 1226, spring arm 1030, bracket 1032, and ground plane interface 1212. In another embodiment, arms 1034 and 1036 may also provide an electrical coupling between the ground plane of board 1220 and the ground plane of housing member 1210. In this embodiment, the ground coupling can be achieved in the following path: logic board ground plane, arms 1034 and 1036, bracket 1032, and ground plane interface 1212. In yet another embodiment, the ground coupling can be achieved through both the screw coupling and arm coupling.

Logic board 1220 can include several connection regions for physically coupling IC circuits, conductors, and other components (such as antenna 1230). Antenna 1230 can be coupled to a conductor (e.g., a co-axial conductor) via solder connection 1238. As discussed above, solder connections may not be as secure as threaded connections. Thus, during normal use of device 1200, such connections may be susceptible to disconnection. Diving board 1020 of cowling applies a pre-load force to connection 1238 to ensure the connection remains fixed throughout the life and intended use of device 1200.

Accordingly, cowling 1000 can advantageously provide both electrical grounding between board 1220 and housing member 1210 and a pre-load force as added insurance for securing a logic board connection.

Figure 13A:
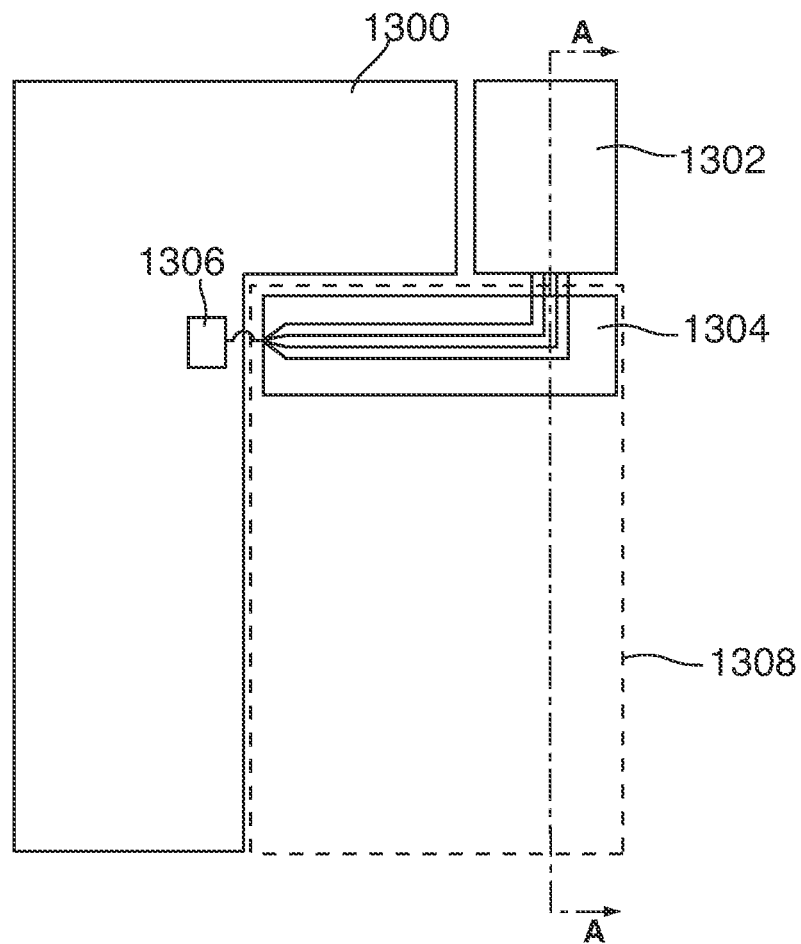
FIG. 13A shows an illustrative top view of a main logic board, a secondary logic board, and a flex connection in accordance with an embodiment of the invention.

FIG. 13A shows an illustrative top view of a main logic board ("MLB") 1300, a secondary logic board ("SLB") 1302, and flex connection 1304 in accordance with an embodiment of the invention. MLB 1300 can be the same as or similar to MLB 300 of FIG. 3. In some embodiments, SLB 1302 can provide connections to an audio jack of an electronic device (not shown in FIG. 13).

Due to space constraints of the device, board to board connections cannot be formed between MLB 1300 and SLB 1302. Accordingly, connections between MLB 1300 and SLB 1302 may need to be formed using flex connection 1304. For example, as shown in FIG. 13A, flex connection 1304 can extend between board connection 1306 of MLB 1300 and SLB 1302. In some cases, board connection 1306 can be the same as or similar to one of board connections 314A-G of FIG. 3.

In some embodiments, space constraints may require flex connection 1304 to be formed underneath another component of an electronic device. For example, as shown in FIG. 13A, flex connection 1304 may be formed underneath battery 1308 (as indicated by the dashed line).

The thinness of a device may further constrain the type of flex connection that can be used to connect MLB 1300 and SLB 1302. For example, flex connection 1304 may need to be a single-layer flex connection in order to satisfy the thickness constraints of the device.

Figure 13B:
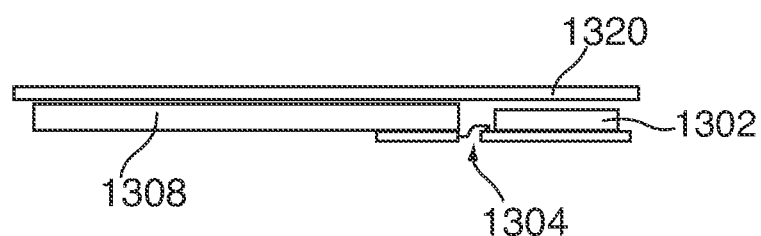
FIG. 13B shows a cross-sectional view of the secondary logic board and the flex connection of FIG. 13A taken along line A-A in accordance with an embodiment of the invention.

FIG. 13B shows a cross-sectional view of SLB 1302 and flex connection 1304 of FIG. 13A taken along line A-A. As shown in FIG. 13B, because there is no gap between battery 1308 and glass 1320 of the electronic device, flex connection 1304 is required to lie underneath battery 1308.

The previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:

1. A portable electronic device, comprising:
   a magnetometer;
   a logic board having a board connector;
   a flexible circuit, wherein the magnetometer is mounted on the flexible circuit, and wherein the flexible circuit is coupled to the board connector; and
   a housing having an outer periphery member, wherein the magnetometer and flexible circuit are attached directly to the outer periphery member, and wherein the outer periphery member forms an exterior surface of the portable electronic device.

2. The portable electronic device defined in claim 1, further comprising a mounting bracket that secures the magnetometer and the flexible circuit to the outer periphery member.

3. The portable electronic device defined in claim 1, wherein the flexible circuit includes traces that route data signals between the board connector and the magnetometer.

4. The portable electronic device defined in claim 3, wherein the traces provide power from the logic board to the magnetometer.

5. A portable electronic device, comprising:
   a housing having a rigid mounting structure;
   a logic board having a board connector;
   a flexible printed circuit board connected to the board connector;
   a compass mounted to the flexible printed circuit board and to the rigid mounting structure; and
   a bracket that mounts the compass to the rigid mounting structure.

6. The portable electronic device defined in claim 5, wherein the rigid mounting structure is separate from the logic board.

7. The portable electronic device defined in claim 5, wherein the rigid mounting structure is part of an outer periphery member.

8. The portable electronic device defined in claim 5, wherein the compass measures a component of a magnetic field in a particular direction relative to a spatial orientation of the device.

9. The portable electronic device defined in claim 5, wherein the bracket covers at least a portion of the compass and the flexible printed circuit board.

10. The portable electronic device defined in claim 5, wherein the flexible printed circuit board includes traces that route data signals between the board connector and the compass.

11. The portable electronic device defined in claim 10, wherein the traces provide power from the logic board to the compass.

12. The portable electronic device defined in claim 5, further comprising:
   a fastener that mounts the compass to the rigid mounting structure.

13. The portable electronic device defined in claim 5, wherein the rigid mounting structure comprises an inner surface, wherein the compass is mounted to the inner surface of the rigid mounting structure.

14. The portable electronic device of claim 5, wherein the rigid mounting structure comprises an internal platform secured to an outer periphery member of the device.

15. The portable electronic device of claim 14, wherein the internal platform is secured to the outer periphery member of the device using one selected from the group consisting of: snaps, fasteners, flexures, welds, or adhesive.

16. The portable electronic device of claim 5, wherein the portable electronic device is a cellular telephone.

17. The portable electronic device of claim 5, wherein the compass is mounted to a first portion of the flexible printed circuit board, and wherein the board connector is mounted to a second portion of the flexible printed circuit board.

18. A portable electronic device, comprising:
- a housing having a rigid mounting structure;
- a logic board having a board connector;
- a flexible printed circuit board connected to the board connector;
- a magnetometer mounted to the flexible printed circuit board and to the rigid mounting structure; and
- a bracket that mounts the magnetometer to the rigid mounting structure.

19. The portable electronic device defined in claim 1, further comprising a fastener that attaches the magnetometer and flexible circuit directly to an inner surface of the outer periphery member.

\* \* \* \* \*